(12) United States Patent
Manger (10) Patent No.: US 7,074,660 B2
(45) Date of Patent: Jul. 11, 2006

(54) FINFET DEVICE AND METHOD OF FABRICATION

(75) Inventor: Dirk Manger, Dresden (DE)

(73) Assignee: Infineon Technologies AG, Munich (DE)

( * ) Notice: Subject to any disclaimer, the term of this patent is extended or adjusted under 35 U.S.C. 154(b) by 92 days.

(21) Appl. No.: 10/765,910

(22) Filed: Jan. 29, 2004

(65) Prior Publication Data

US 2005/0014318 A1    Jan. 20, 2005

(30) Foreign Application Priority Data

Jan. 30, 2003    (DE) .............................. 103 03 771

(51) Int. Cl.
   *H01L 21/336*    (2006.01)
   *H01L 21/8234*   (2006.01)
   *H01L 21/8238*   (2006.01)

(52) U.S. Cl. ..................... 438/197; 438/275; 438/199; 438/258

(58) Field of Classification Search ................ 438/197, 438/399, 201, 279, 275, 199
See application file for complete search history.

(56) References Cited

U.S. PATENT DOCUMENTS

| 6,413,802 B1 | 7/2002 | Hu et al. |
| 6,583,469 B1 * | 6/2003 | Fried et al. .................. 257/329 |
| 6,610,576 B1 * | 8/2003 | Nowak ........................ 438/301 |

OTHER PUBLICATIONS

Yu, B., et al., "FinFET Scaling to 10nm Gate Length," IEDM, 2002, pp. 251-254.

* cited by examiner

*Primary Examiner*—Chuong A. Luu
(74) *Attorney, Agent, or Firm*—Slater & Matsil L.L.P.

(57) ABSTRACT

A transistor fin of a fin field-effect transistor is arranged between two contact structures. A gate electrode encapsulating the transistor fin on three sides is caused to recede by means of a nonlithographic process from contact trenches, which define the contact structures, before the formation of the contact structures. A distance a between the gate electrode and the contact structures is not subject to any tolerances due to the overlay of two independent lithographic masks. For a given extent of the gate electrode along the transistor fin, it is possible to minimize a distance A between the contact structures and thereby significantly increase the packing density of a plurality of fin field-effect transistors on a substrate compared with conventional devices.

18 Claims, 9 Drawing Sheets

FINFET DEVICE AND METHOD OF FABRICATION

BACKGROUND

1. Field of the Invention

The invention relates to a method for fabricating semiconductor devices and in particular fin field-effect transistors.

2. Background of the Invention

Fin field-effect transistors (also called FinFets hereinafter) are a well known alternative to planar or vertical field-effect transistor structures for applications which require field-effect transistors having channel lengths (device length) of less than 100 nm.

Figure 1:
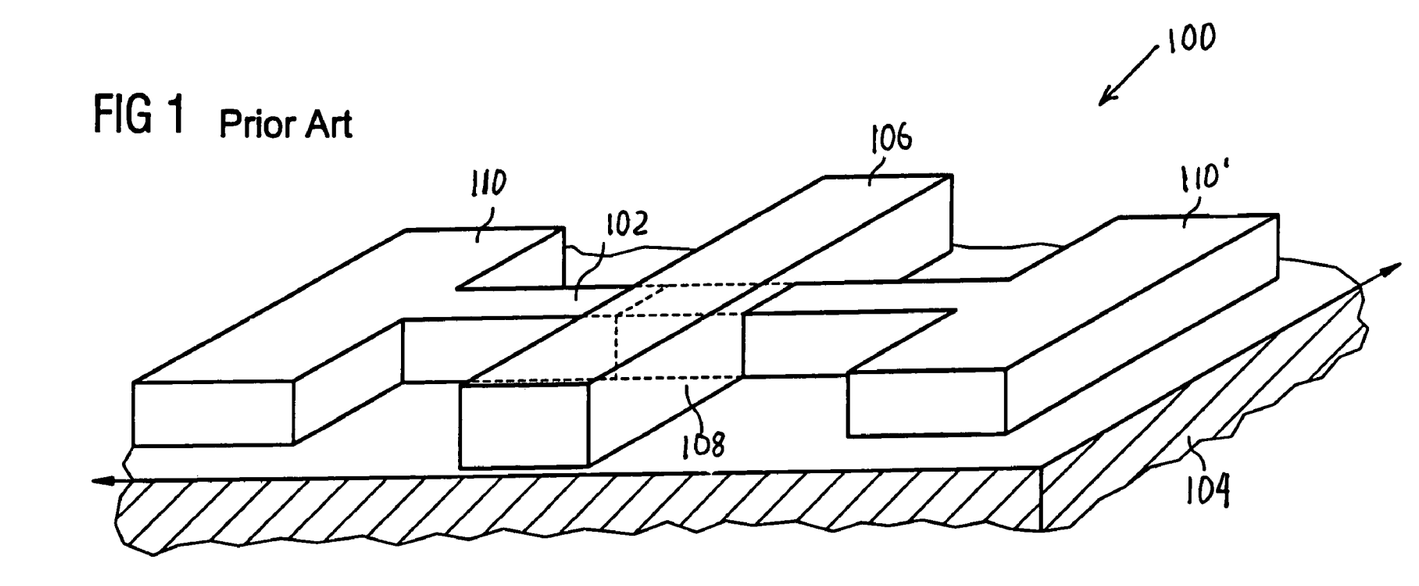
FIG. 1 illustrates a simplified, diagrammatic, perspective illustration of a known fin field-effect transistor structure.

FIG. 1 illustrates a fin field-effect transistor 100 in simplified fashion. A fin 102 made of a semiconductor material is formed on a substrate 104. Fin 102 is encapsulated by a gate electrode structure 106 from three sides in a section 108. A gate dielectric (not illustrated in the figure) is arranged between the gate electrode structure 106 and fin 102 at least in the section 108. The section 108 of fin 102 is adjoined by source/drain regions S/D, S/D' on both sides. In the example illustrated, the source/drain regions 110, 110' expand at both head ends of fin 102 in order to facilitate a contact connection of the source/drain regions. In addition, even further FinFet structures are known which differ in the formation of the source/drain regions and of the fin. It is also known, for example, that a plurality of fins can be formed parallel to one another between two corresponding source/drain regions of a fin field-effect transistor.

A characterizing feature of fin field-effect transistors is that even at a low gate voltage, majority carriers are removed to a high degree from a channel region (also called active region hereinafter) in which a conductive channel forms in the activated state of the fin field-effect transistor. A parasitic flow of charge carriers to or from the source/drain regions and thus a leakage current via the active region are thus reduced in the nonactivated state of the fin field-effect transistor. Disadvantageous short channel effects known from conventional planar and vertical field-effect transistor structures occur to a lesser extent.

A particular disadvantage about known concepts for fabricating fin flied-effect transistors is that, relative to channel length, the fin field-effect transistors can only be arranged in a relatively low packing density compared with conventional planar or vertical field-effect transistor structures. This is disadvantageous, in particular, in an application of the fin field-effect transistors as selection transistors of capacitive memory cells.

SUMMARY

An exemplary embodiment of the present invention provides a method for fabricating fin field-effect transistors which, among other advantage, enables a higher packing density of the fin field-effect transistors compared with conventional FinFETs. A preferred embodiment further provides a fin field-effect transistor that can be arranged in a high packing density.

In accordance with an exemplary embodiment of the present invention, a method for fabricating a fin field-effect transistor or an arrangement of fin field-effect transistors includes a step of providing at least one original fin made of a semiconductor material on a substrate by means of a first lithography step. A gate dielectric layer is provided either by growth or by deposition at least on the longitudinal sides of the fin. A gate electrode layer made of a conductive gate electrode material is arranged above the gate dielectric layer. Contact trenches are introduced into the original fin by means of a second lithography step, which contact trenches pattern the original fin in a longitudinal direction. In this case, a transistor fin with a first head end and with a second head end at a distance of a fin length from the latter emerges from the original fin, a gate dielectric assigned to the transistor fin emerges from the gate dielectric layer and a gate electrode assigned to the transistor fin emerges from the gate electrode layer. The gate electrode is caused to recede from both head ends, so that it extends over a controllable channel length along the longitudinal sides of the transistor fin.

In the transistor fin, a first source/drain region is formed from the first head end and a second source/drain region is formed from the second head end, an active region with a geometrical channel length remaining between the two source/drain regions in the transistor fin. By filling the contact trenches, the first source/drain region is connected to a first source/drain contact structure and the second source/drain region is connected to a second source/drain contact structure.

In another embodiment, a fin field-effect transistor fabricated according to the above method provides advantages over conventional fin field-effect transistors.

The fin field-effect transistor according to the invention includes, in a known manner, a transistor fin, which is formed on a substrate and extends between two head ends in a longitudinal direction and whose longitudinal sides are covered by a gate dielectric. A gate electrode is provided at least in sections on the gate dielectric, and extends in the longitudinal direction over a controllable channel length. Likewise in a known manner, source/drain regions are formed at the two head ends of the transistor fin of the fin field-effect transistor according to the invention. An active region is formed over a geometrical channel length between the two source/drain regions. The source/drain regions in each case adjoin a corresponding contact structure.

The fin field-effect transistor according to the invention includes gate spacer structures, which are arranged between the gate electrode, the gate dielectric, an isolating dielectric and the contact structures, making it possible to control the extent of said gate spacer structures in the longitudinal direction of the transistor fin with respect to the head ends in lithography-independent fashion. In the fin field-effect transistor according to the invention, the distance between the gate electrode and the contact structures is therefore significantly reduced in an advantageous manner compared with known field-effect transistors.

Preferably, the geometrical channel length of the fin field-effect transistor according to the invention is preferably greater than or equal to the controllable channel length.

DETAILED DESCRIPTION OF THE PREFERRED EMBODIMENTS

The following list of reference symbols is used consistently in the discussion to follow.

LIST OF REFERENCE SYMBOLS

Figure 2:
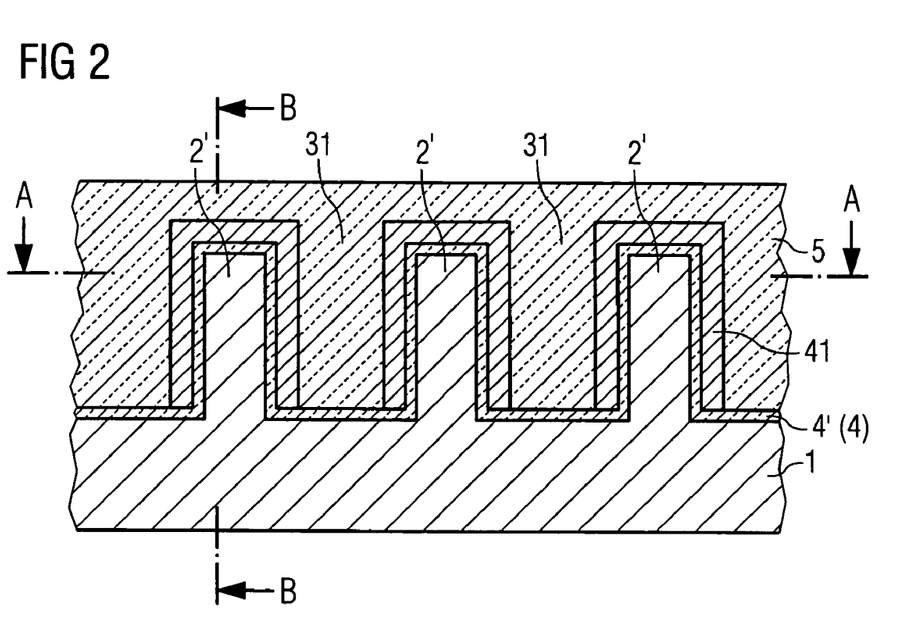
FIG. 2 illustrates a diagrammatic cross section perpendicular to three fin field-effect transistors which are arranged next to one another, in accordance with an exemplary embodiment of the present invention.

1 Substrate
2 Transistor fin
2' Original fin
31 Trench
32 Contact trench
4 Gate dielectric
4' Gate dielectric layer
41 Prepatterned gate electrode layer
42 Gate electrode
5 Isolating dielectric
70 Divot
71 Gate spacer structure
8 Source/drain region
9 Isolating coating
91 Contact structure
cdl Controllable channel length
gdl Geometrical channel length
SUB Substrate
A Contact distance
A' Contact distance
A Minimum distance gate electrode/contact structure
Δl Maximum lithographic offset
S/D Source/drain region
G Gate
F Fin
Ch Body region FIG. 2 shows a cross section through three original fins 2' arranged next to one another for fin field-effect transistors fabricated in accordance with an embodiment of the present invention, after the application of an isolating dielectric 5. In this case, firstly original fins 2' arranged next to one another and running parallel, are formed on a semiconductor substrate 1 by a first lithography step. In the present exemplary embodiment, the material of the original fins 2' and tat of the semiconductor substrate 1 is monocrystalline silicon.

A conformal gate dielectric layer 4' is deposited onto or grown on the original fins 2'. A gate electrode material is deposited onto gate dielectric layer 4', which covers at least original fins 2'. In the example illustrated, the gate electrode material firstly forms an unpatterned gate electrode layer (not shown). A nonconformal mask (not illustrated) is applied to the gate electrode layer. In the bottom region of trenches 31 formed between original fins 2', sections of the gate electrode layer are left free by the nonconformal mask, and are subsequently removed by means of an etching step. The gate electrode layer is prepatterned in this way. Sections of the prepatterned gate electrode layer 41 are insulated from one another and associated with an original fin 2'. An isolating dielectric 5 is applied over prepatterned gate electrode layer 41.

Figure 3A:
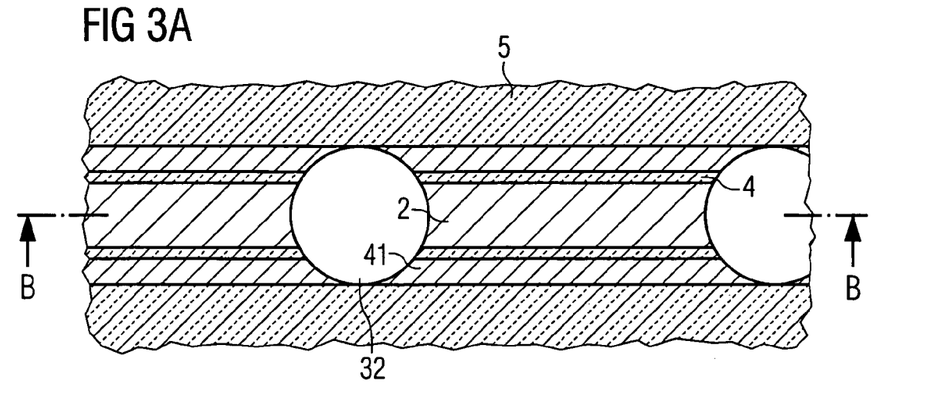
FIGS. 3a and 3b illustrate a plan view and a cross section, respectively, in the longitudinal direction through a fin field-effect transistor in a first phase of formation, in accordance with an exemplary embodiment of the present invention.
Figure 3B:
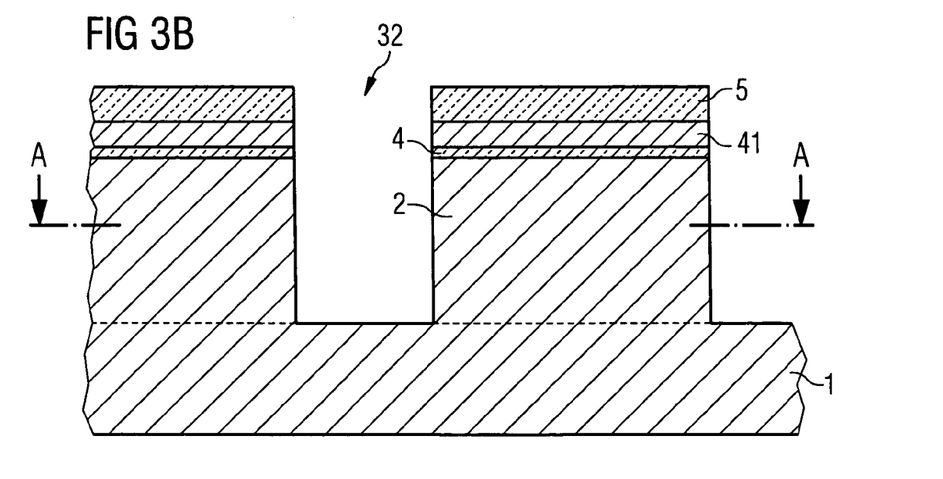

FIG. 3b and FIG. 3a depict the state of a FinFET after the application of isolating dielectric 5 and the introduction of contact trenches 32 in a cross section along a transistor fin 2, and in a plan view of transistor fin 2, respectively. Transistor fin 2 emerges from an original fin 2' in which contact trenches 32 have been introduced by means of a second lithography step. In this case, contact trenches 32 are provided essentially with the same depth as trenches 31 between transistor fins 2. Contact trenches 32 are introduced by a nonselective etching step, and pattern isolating dielectric 5, prepatterned gate electrode layer 41, gate dielectric layer 4' and original fin 2' in a longitudinal extent of original fin 2'. In this case, transistor fin 2, whose length is defined by the distance between contact trenches 32, arises from original fin 2' and gate dielectric 4 arises from gate dielectric layer 4'.

Figure 4A:
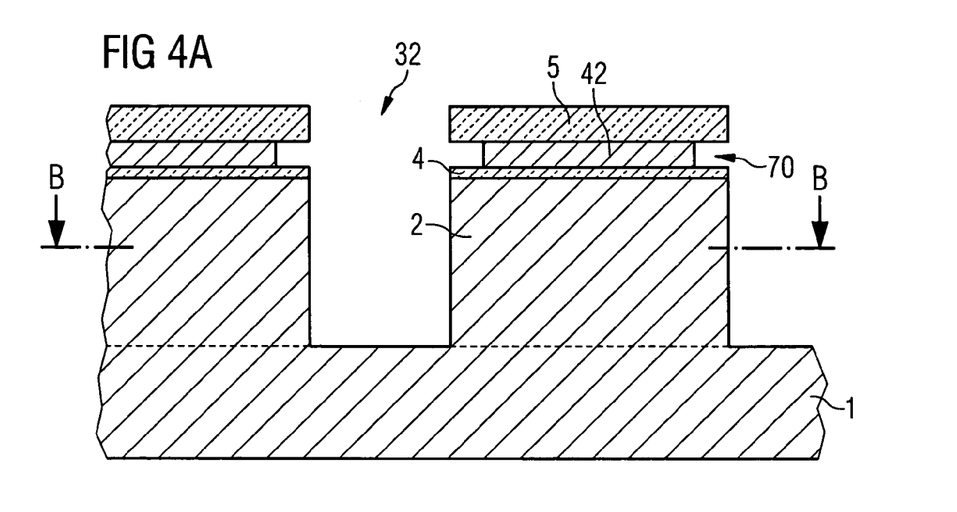
FIGS. 4a and 4b illustrate a plan view and a cross section, respectively, in the longitudinal direction through a fin field-effect transistor according to the invention in a second phase of formation, in accordance with an exemplary embodiment of the present invention.
Figure 4B:
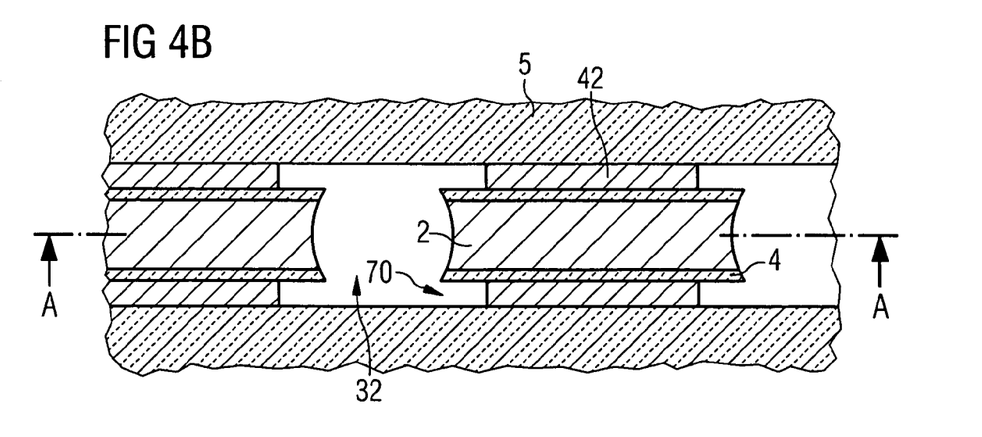

FIGS. 4a and 4b illustrate the state of a fin field-effect transistor fabricated in accordance with an exemplary embodiment of the present invention, after the gate electrode material has been caused to recede by means of a selective, isotropic etching of a gate electrode 42. As a result of the gate electrode material having been caused to recede, divots 70 are produced from contact trenches 32 between isolating dielectric 5 and gate dielectric 4. The depth of divots 70 is defined by the process parameters of the etching step, but not by a lithography step. An extent of gate electrode 42 along transistor fin 2 can therefore be set very precisely. Gate electrode 42 is formed symmetrically with respect to contact trenches 32 and does not require a separate lithography step. The distance between contact trenches 32 can therefore be minimized independently of lithography tolerances in dependence on a required channel length.

Figure 5A:
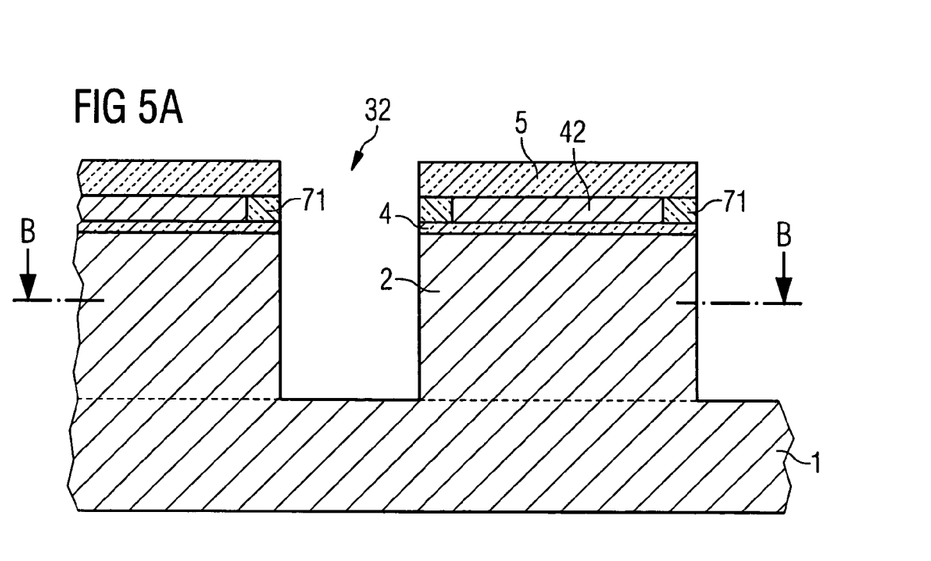
FIGS. 5a and 5b illustrate a plan view and a cross section, respectively, in the longitudinal direction through a fin field-effect transistor in a third phase of formation, in accordance with an exemplary embodiment of the present invention.
Figure 5B:
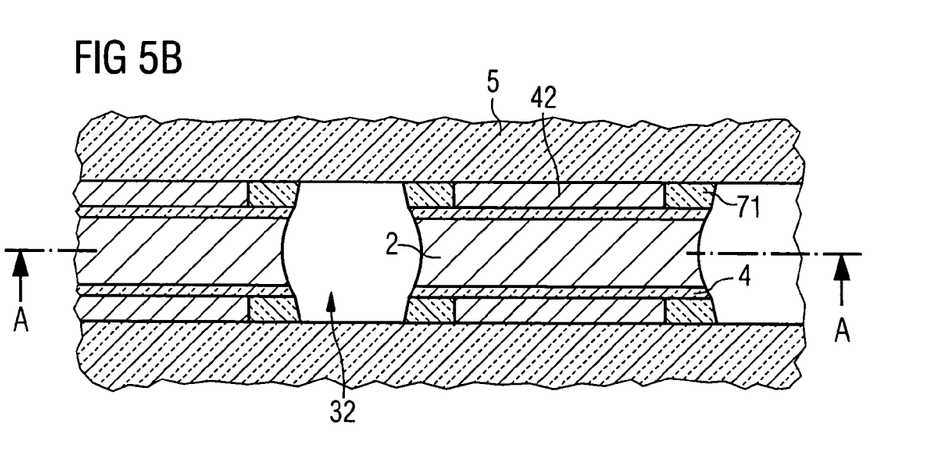

FIGS. 5a and 5b illustrate a cross-section and plan view, respectively, of the state of a fin field-effect transistor fabricated according to an exemplary embodiment of the present invention after divots 70 have been filled with an insulator material, which forms gate spacer structures 71 (divot fill). Divots 70 are filled for instance by means of a conformal deposition and a subsequent isotropic etching-back of the insulator material.

Figure 6A:
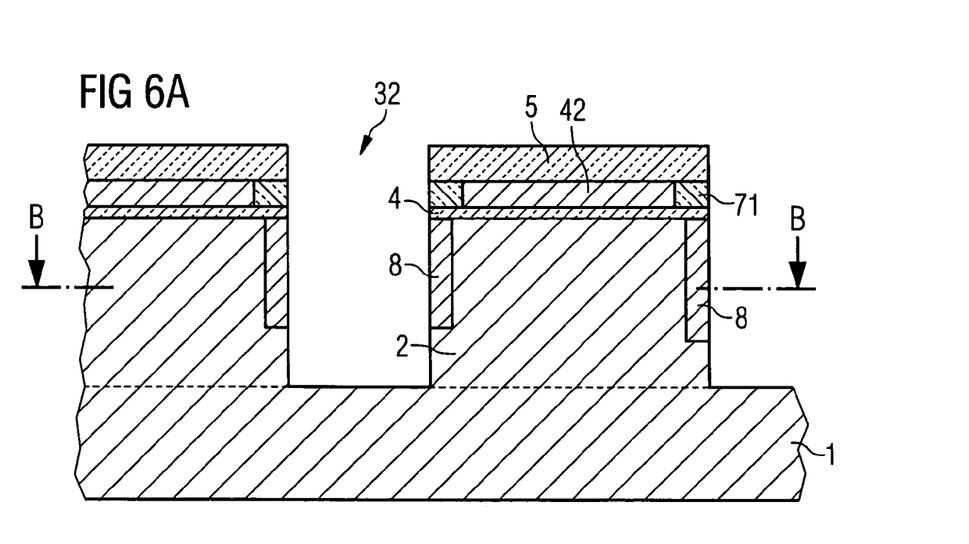
FIGS. 6a and 6b illustrate a plan view and a cross section, respectively, in the longitudinal direction through a fin field-effect transistor in a fourth phase of formation, in accordance with an exemplary embodiment of the present invention.
Figure 6B:
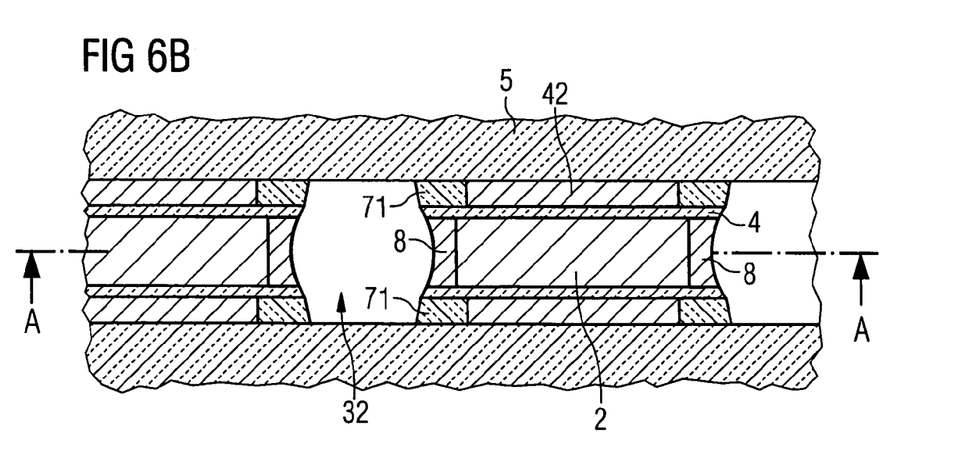

By means of implantation, source/drain regions 8 are subsequently formed at the head ends of transistor fin 2. As depicted in FIGS. 6a and 6b, of a cross-sectional and plan view, respectively, of source/drain regions 8, the source/drain extends into transistor fin 2 from the head ends at most as far as a depth corresponding to gate electrode 42. FIGS.

Figure 7A:
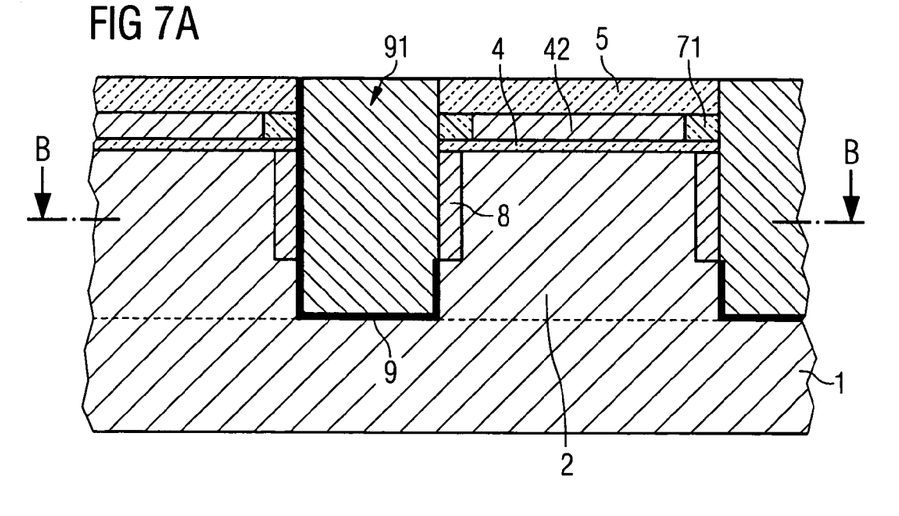
FIGS. 7a and 7b illustrate a plan view and a cross section, respectively, in the longitudinal direction through a fin field-effect transistor in a fifth phase of formation, in accordance with an exemplary embodiment of the present invention.
Figure 7B:
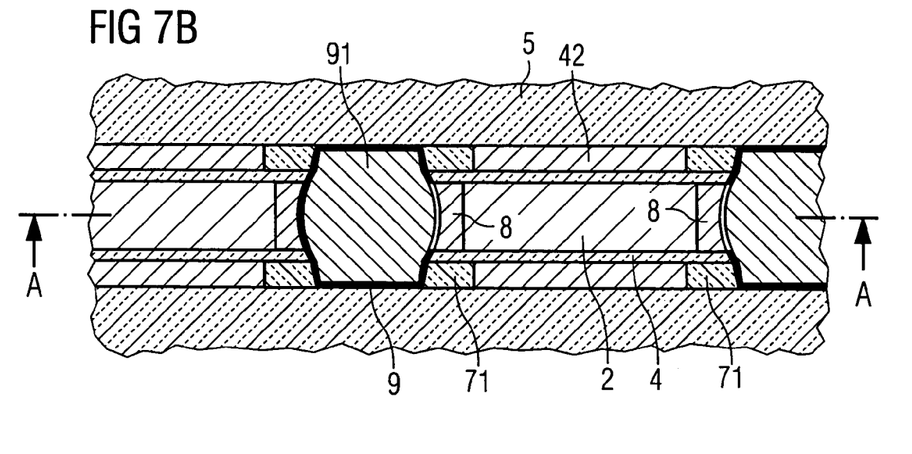

7a and 7b illustrate cross-sectional and plan view perspectives, respectively, of the state of a fin field-effect transistor after the introduction of the conductive contact material into contact trenches 32, in accordance with the present invention. After the formation of source/drain regions 8, contact trenches 32 are lined in sections with an isolating coating 9. This is done for example by means of a conformal deposition of isolating coating 9 and a subsequent patterning on one side isolating coating 9 is introduced into contact trenches 32 in such a way that substantial sections of at least one of adjoining source/drain regions 8 are not covered. Finally, contact trenches 32 are filled with a conductive contact material, so that partial regions of contact structures 91 are formed in contact trenches 32.

Figure 8:
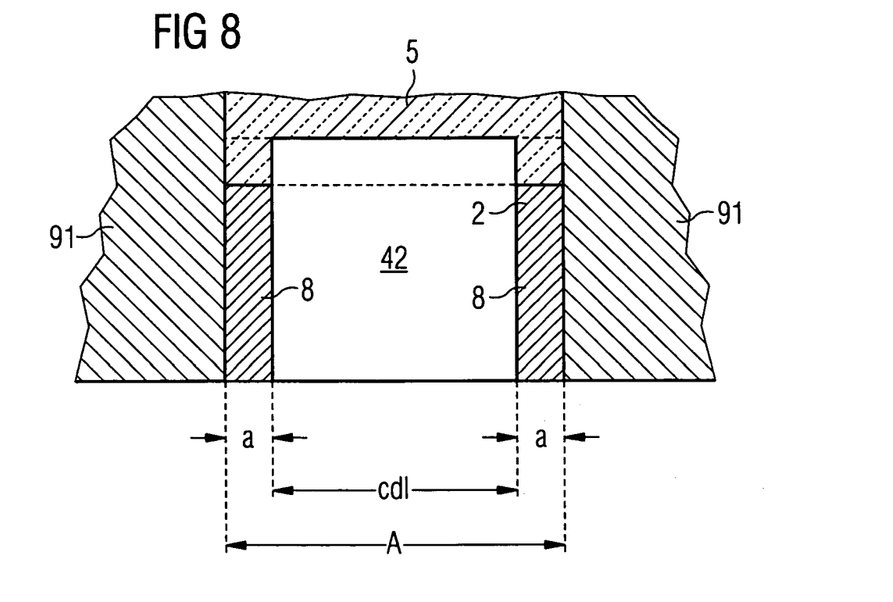
FIG. 8 illustrates diagrammatically a fin field-effect transistor according to a preferred embodiment of the present invention.
Figure 9:
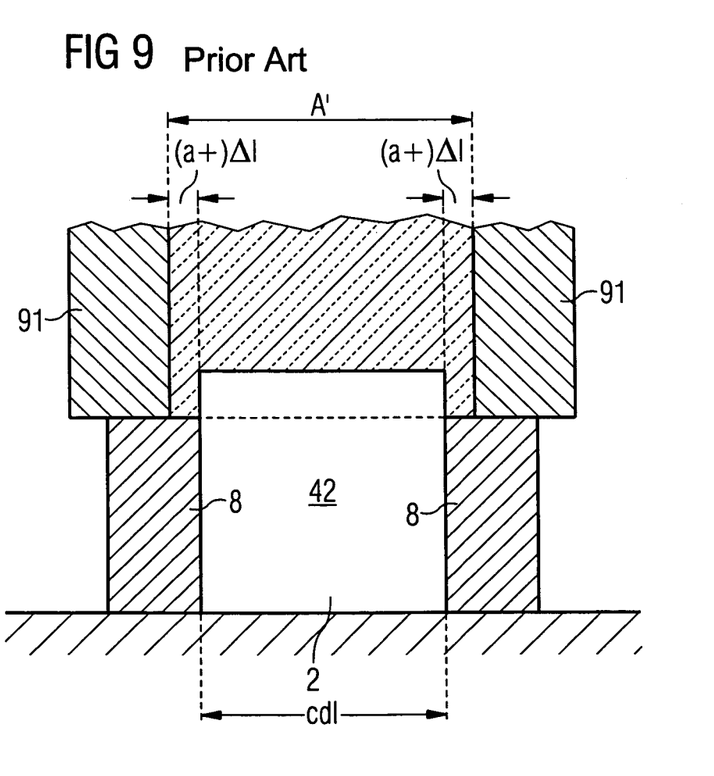
FIG. 9 illustrates diagrammatically a conventional fin field-effect transistor.

The invention's optimization of the distance between gate electrode 42 and source/drain regions 8 or contact structures 91 of source/drain regions 8 becomes clear in the comparison of FIG. 8 with FIG. 9. A fin field-effect transistor fabricated according to an embodiment of the present invention with components that are essential for the explanations below is illustrated in greatly simplified fashion in FIG. 8. A transistor fin 2 arranged between contact structures 91 is encapsulated by a gate electrode 42 on three sides. A distance A between contact structures 91 is defined by a first lithographic mask, which defines contact structures 91. The distance a between gate electrode 42 and contact structures 91 is determined in lithography-independent fashion by implementation of an etching step. The extent of gate electrode 42 in the longitudinal direction of transistor fin 2 determines a controllable channel length cdl of the fin field-effect transistor according to the invention.

By contrast, the extent along transistor fin 2 of gate electrode 42 of a conventional fin field-effect transistor illustrated in FIG. 9 is determined by a further lithographic mask, which defines gate electrode 42. The dictates of production mean that the two lithographic masks cannot be aligned ideally with respect to one another, so that the distance A' between contact structures 91 for a predetermined controllable channel length cdl is to be chosen such that the minimum distance a between gate electrode 42 and contact structures 91 is preserved even under worst-case fault conditions, that is to say a maximum lithographic offset Δl.

In order to ensure reliable product conditions in a production environment for a mass production of semiconductor devices, it is therefore necessary, as a rule, to provide mask layouts for lithographic methods such that a maximum lithographic offset Δl of 0.4 times the minimum feature size F of two lithographic masks of the photolithographic method is tolerable.

Therefore, given an identical controllable channel length cdl, it is necessary, due to the dictates of lithography, for the distance A' between contact structures 91 of FIG. 9 to be provided such that it is significantly greater than the distance A between contact structures 91 of FIG. 8.

Given channel lengths of less than 50 nm, in the case of lithography techniques that are currently customary for these feature sizes, the present invention provides a maximum packing density of FinFETs that is approximately a factor of 1.4 higher by comparison with known fin field-effect transistors, if in each case approximately the minimum feature size F is chosen as distance between the contact structures or the fin field-effect transistors.

This applies particularly when using the fin field-effect transistors as selection transistors of 1T1C memory cells. The layouts that are customary for this type of memory cells (e.g. the checkerboard layout) can be realized with a higher packing density in the same way using the fin field-effect transistors according to the invention. In this case, for instance, the storage capacitor of the memory cell is formed as a trench capacitor below in each case one of the contact trenches of the fin field-effect transistor and is connected to the source/drain region thereof, while a contact structure assigned to the second source/drain region of the fin field-effect transistor imparts a connection to a data line (bit line).

Figure 10:
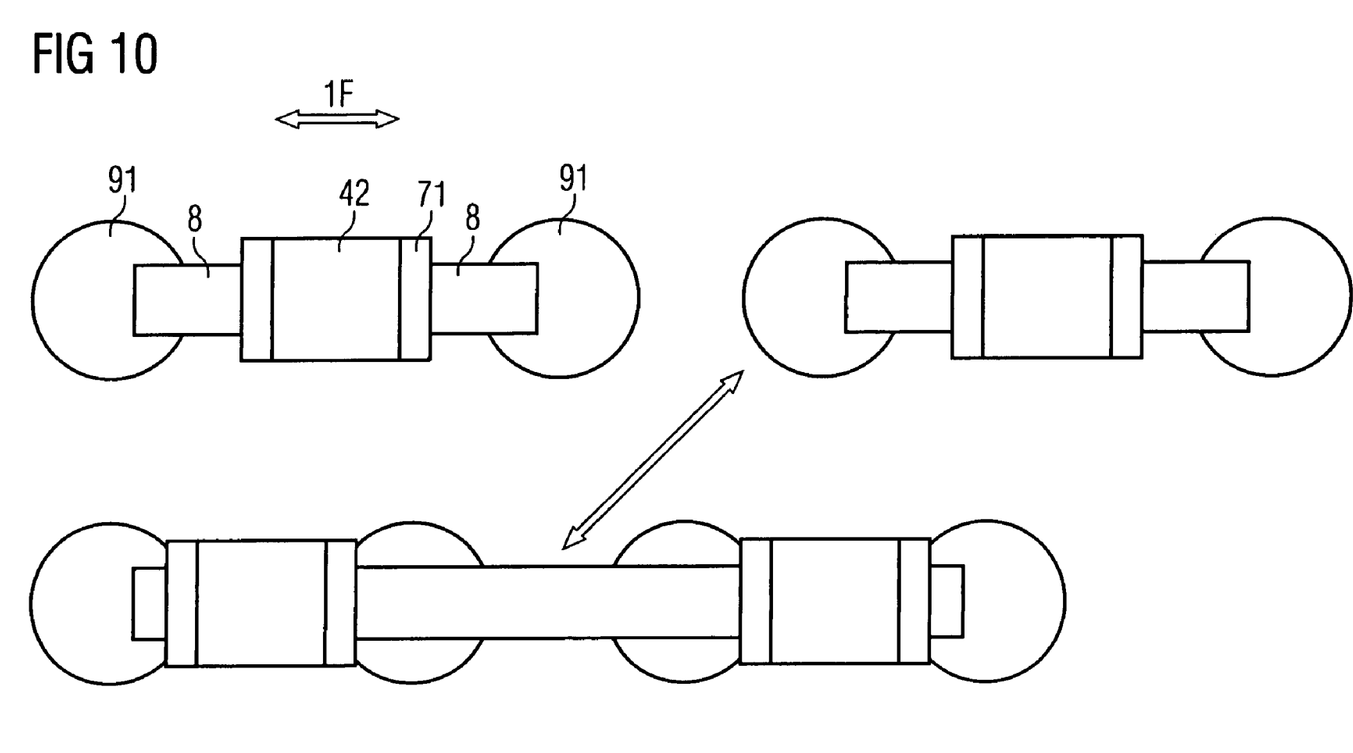
FIG. 10 illustrates a diagrammatic comparison between an arrangement of fin field-effect transistors according to an embodiment of the present invention and an arrangement of fin field-effect transistors of a known type.

FIG. 10 shows, at the top, an arrangement, which is as dense as possible, of two fin field-effect transistors of known type which are adjacent in the longitudinal direction and, at the bottom, the corresponding arrangement of two fin field-effect transistors according to the present invention, with the same controllable channel length, in each case with respect to a minimum feature size F. The fin field-effect transistors, of which source/drain regions 8, gate spacer structures 71 and gate electrode 42 are in each case illustrated diagrammatically, are in each case arranged between two contact structures 91. Given an identical size of fin field-effect transistors, the fin field-effect transistors can be arranged according to the present invention to achieve approximately 30% denser packing than conventional FinFETs, since contact structures 91 can be arranged at a distance approximately of the feature size F.

An embodiment of the present invention thus brings about a final formation of the gate electrode relative to the source/drain contact structures, or the formation of source/drain contact structures in a self-aligned manner with respect to the gate electrode. The distance between the gate electrode and the source/drain contact structures is independent of a lithography step. As a result, an offset which takes into account a maximum lithography-dictated deviation of the distance can also be significantly reduced compared with conventional methods, in which the source/drain contact structures are generally produced in a lithography step that is independent of the gate electrode. The present invention provides embodiments where the distance between the gate electrode and the source/drain contact structures is significantly smaller relative to an identical channel length. A plurality of adjacent fin field-effect transistors can thus be arranged in a higher packing density.

If a plurality of original fins which are arranged next to one another and run parallel are formed by means of the first lithography step, then a gate electrode layer may be prepatterned before the formation of the gate electrodes in such a way that the gate electrode layer, in each case in a bottom region of trenches formed between the original fins, is divided into sections that are separated from one another. Each original fin is associated with an insulated section of the gate electrode layer. The number of lithography steps is advantageously reduced further in this way.

In a particularly preferred embodiment, the gate electrode layer emerges from an essentially conformal deposition. The prepatterning of the gate electrode layer then comprises the provision of a nonconformal mask, by which at least the gate electrode material on the original fins is covered, while the gate electrode material in the bottom region of the trenches is left free. The nonconformal mask may be provided in a known manner, for instance, by means of a nonconformal sequential vapor deposition of $Al_2O_3$, in which case, in the course of the individual cycles of the sequential vapor deposition, the trench walls of the trenches are covered directionally from the top and the cycles of the sequential vapor deposition may then be terminated before the bottom region is covered. Alternatively, the nonconformal mask may be provided by means of a plasma enhanced chemical vapor deposition (PECVD) with a high deposition rate. In the latter case, a mask material is deposited with a higher layer thickness on the original fins or in the upper region of the trenches than in the bottom region of the trenches. By means of a subsequent isotropic or anisotropic removal process, the mask material is subsequently caused to recede partly, so that it is removed from the bottom regions and remains on the original fins and along the trench walls.

After the application of the mask, the gate electrode layer is removed from the bottom regions which are not covered, or are only covered with a small thickness, by the nonconformal mask. After the prepatterning of the gate electrode layer, the nonconformal mask may remain on the gate electrode layer. However, the nonconformal mask is preferably removed after the prepatterning of the gate electrode layer.

The gate dielectric layer may be provided either by growth of an oxide on the semiconductor material of the original fin or by means of deposition. Furthermore, in a preferred embodiment, after prepatterning of the gate electrode layer and before the second lithography step, an isolating dielectric is applied to the prepatterned gate electrode layer or the left-free sections of the gate dielectric layer or of the substrate.

Introduction of the contact trenches into the original fins in the course of the second lithography step may be carried out by means of a masked, nonselective etching. In this case, the diameter of the contact trenches is chosen such that transistor fins with in each case two head ends defined by the contact trenches are produced even in the event of a maximum deviation of the second lithography mask relative to the first lithography mask, which forms the original fins.

The process of causing the gate electrode to recede is preferably carried out by means of an etching step that causes the gate electrode material to selectively recede. In accordance with a preferred embodiment of the present invention, doped polysilicon is provided as gate electrode material. The gate electrode material may then be processed in a simple and preferred manner by means of an etching step in a Cl plasma or an HBr plasma.

In order to prevent the divots produced as a result of receding of the gate electrode from being filled undesirably with a conductive material, the divots may be filled with a filling material made of a nonconductive material. For this purpose, silicon nitride, for instance, may be deposited by a method with high edge coverage to a thickness at which the divots are just reliably filled. Afterward, the silicon nitride may be etched back isotropically and the etching operation terminated after approximately the single layer thickness of the deposited silicon nitride has been removed.

The formation of source/drain regions in the transistor fin is preferably performed in a known manner, for instance by means of inclined implantation, or a temporary introduction of a doped material into the contact trenches with subsequent, if appropriate masked, out diffusion.

Before the contact trenches are filled with a conductive material, they are preferably lined in sections by an isolating coating. Those surfaces of the source/drain regions which adjoin the contact trenches remain uncoated in the region of the head ends of the transistor fin. After the contact trenches have been filled with a conductive material, in each case precisely one source/drain region is then connected to a contact structure provided in the contact trench.

Preferably, the isolating coating is deposited conformally and subsequently patterned on one side. Patterning on one side of the isolating coating may be accomplished, for example, by altering the etching resistance of the isolating coating on one side using inclined implantation. Subsequently, the isolating coating is patterned in an etching step that is selective with respect to the altered and unaltered sections of the isolating coating.

A distance between the source/drain regions in the transistor fin defines a geometrical channel length. The extent of the gate electrode along the transistor fin defines a controllable channel length. According to a preferred embodiment of the present invention, the geometrical channel length is provided such that it is greater than or equal to the controllable channel length, in order to keep down a gate/drain capacitance or a gate/source capacitance.

The foregoing disclosure of the preferred embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for fabricating fin field-effect transistors, comprising:
   providing at least one original fin made of a single crystalline semiconductor material on a substrate by means of a first lithography step, then
   providing a gate dielectric layer over longitudinal sides of the at least one original fin, then
   providing a gate electrode layer made of a conductive gate electrode material over the gate dielectric layer;
   forming contact trenches that pattern the at least one original fin in a longitudinal direction by means of a second lithography step, wherein at least one transistor fin with a first head end and a second head end at a distance of a fin length from the first head end emerges from the at least one original fin, and wherein a gate electrode associated with the transistor fin emerges from to gate electrode layer; and then
   processing the gate electrode, wherein the gate electrode recedes from both head ends; and
   forming a source/drain-region in each transistor fin from the respective two head ends respectively.

2. The method of claim 1, further comprising:
   forming a source/drain region in the transistor fin from the two head ends; and
   connecting the source/drain regions to source/drain contact structures made of a conductive contact material, wherein the gate electrode material recedes from both head ends except for a controllable channel length.

3. The method of claim 2, wherein, by means of the first lithography step, a plurality of original fins which are arranged next to one another and run parallel are formed and the gate electrode layer is prepatterned before the formation of the gate electrodes, and wherein the gate electrode layer in a bottom region of trenches formed between the original fins is subdivided into sections that are separated from one another and in each case associated with one of the original fins.

4. The method of claim 3, wherein the gate electrode layer essentially emerges from a conformal deposition, and wherein the prepatterning of the gate electrode layer comprises:
    providing a nonconformal mask, by which at least the gate electrode material bearing on the original fin is covered, and at least the bottom region of the trenches is in each case left free; and
    removing sections of the gate electrode layer from the bottom regions not covered by the mask.

5. The method of claim 4, wherein the providing the nonconformal mask comprises:
    depositing a nonconformal mask material, wherein the mask material is deposited with a smaller layer thickness in the bottom region of the trenches than on the original fins; and
    causing the mask material to recede, so that the mask material is removed from the bottom region of the trenches and remains on the original fins.

6. The method of claim 5, wherein the nonconformal mask is removed after the prepatterning of the gate electrode layer.

7. The method of claim 2, wherein after the prepatterning of the gate electrode layer and before the second lithography step, a first isolating dielectric is applied to a prepatterned gate electrode layer.

8. The method of claim 2, wherein the contact trenches are introduced in the course of the second lithography step by means of a nonselective etching step.

9. The method of claim 2, wherein the process of causing the gate electrode to recede comprises an etching step which causes the gate electrode material to selectively recede.

10. The method as claimed in claim 9, wherein doped polysilicon is provided as gate electrode material.

11. The method of claim 10, wherein the gate electrode material is caused to recede by means of an etching step in a Cl plasma or an HBr plasma.

12. The method of claim 9, whereindivots produced as a result of the gate electrode material having been caused to recede are filled with a filling material.

13. The method of claim 2, wherein the source/drain regions are produced in the transistor fin by means of implantation.

14. The method of claim 3, wherein the contact trenches are lined at least partly by an isolating coating, wherein all of the conductive sections adjoining the respective contact trench are covered by means of the isolating coating, with the exception in each case of a source/drain region adjoining one of the contact trenches.

15. The method of claim 14, wherein the isolating coating is applied conformally and subsequently patterned on one side.

16. The method of claim 15,
    wherein the etching resistance of the isolating coating is altered on one side by means of inclined implantation, and wherein an etching that is selective relative to altered and unaltered sections of the isolating coating is subsequently carried out.

17. The method of claim 2, wherein the contact trenches are filled with conductive material.

18. The method of claim 2, wherein a geometrical channel length of a channel region formed between the two source/drain regions is provided, such that the geometrical channel length is greater than or equal to a controllable channel length.

* * * * *